United States Patent
Fukushima et al.

(10) Patent No.: US 7,581,310 B2
(45) Date of Patent: Sep. 1, 2009

(54) ELECTRONIC COMPONENT MOUNTING APPARATUS

(75) Inventors: Yoshiharu Fukushima, Gunma (JP); Takahiro Nagata, Ota (JP); Katsuyuki Seto, Ota (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 344 days.

(21) Appl. No.: 11/054,625

(22) Filed: Feb. 10, 2005

(65) Prior Publication Data

US 2005/0177998 A1  Aug. 18, 2005

(30) Foreign Application Priority Data

Feb. 13, 2004  (JP) .............................. 2004-037393

(51) Int. Cl.
*B23P 19/00* (2006.01)
(52) U.S. Cl. ..................... 29/743; 29/740; 29/741; 29/759; 29/833
(58) Field of Classification Search ........... 29/740–745, 29/833–834, 759–760; 414/737, 752; 901/40, 901/47; 294/64.1
See application file for complete search history.

(56) References Cited

U.S. PATENT DOCUMENTS

| | | | | |
|---|---|---|---|---|
| 4,794,689 A | * | 1/1989 | Seno et al. ..................... | 29/740 |
| 5,010,474 A | * | 4/1991 | Tsuruta et al. ................. | 700/57 |
| 5,060,366 A | * | 10/1991 | Asai et al. ...................... | 29/739 |
| 5,172,468 A | * | 12/1992 | Tanaka et al. .................. | 29/721 |
| 5,203,061 A | * | 4/1993 | Hamada ..................... | 29/33 M |
| 5,579,572 A | * | 12/1996 | Kashiwagi et al. ............. | 29/836 |
| 6,012,222 A | * | 1/2000 | Asai et al. ...................... | 29/832 |
| 6,088,911 A | * | 7/2000 | Isogai et al. .................. | 29/740 |
| 6,101,707 A | * | 8/2000 | Kano et al. .................... | 29/740 |
| 6,507,997 B2 | * | 1/2003 | Kawai et al. ................... | 29/833 |
| 6,591,493 B1 | * | 7/2003 | Yoshida et al. ................ | 29/832 |
| 6,678,944 B1 | * | 1/2004 | Kawada ........................ | 29/740 |
| 6,739,036 B2 | * | 5/2004 | Koike et al. ................... | 29/743 |
| 6,920,686 B2 | * | 7/2005 | Okamoto et al. .............. | 29/740 |
| 6,986,195 B2 | * | 1/2006 | Seto et al. ..................... | 29/740 |

FOREIGN PATENT DOCUMENTS

| | | |
|---|---|---|
| JP | 2001-156498 | 6/2001 |
| JP | 2002-111284 | 4/2002 |

OTHER PUBLICATIONS

European Search Report dated May 28, 2009, directed to corresponding European Application No.: 05003104.6; (3 pages).

* cited by examiner

*Primary Examiner*—Minh Trinh
(74) *Attorney, Agent, or Firm*—Morrison and Foerster LLP

(57) ABSTRACT

The invention provides an electronic component mounting apparatus which can obtain a relative vertically moving stroke of a suction nozzle and is applicable to electronic components ranging from thin to thick ones. The electronic component mounting apparatus of the invention has a suction nozzle for picking an electronic component up from a plurality of component feeding units supplying the electronic component to a component pickup position and mounting the electronic component on a printed board, where a mounting head movable along a beam can move vertically by a head vertical movement device and the suction nozzle provided on the mounting head can move vertically by a nozzle vertical movement device 50.

6 Claims, 11 Drawing Sheets

ELECTRONIC COMPONENT MOUNTING APPARATUS

CROSS-REFERENCE OF THE INVENTION

This invention is based on Japanese Patent Application No.2004-37393, the content of which is incorporated by reference in its entirety.

BACKGROUND OF THE INVENTION

1. Field of the Invention

This invention relates to an electronic component mounting apparatus for picking up an electronic component by a suction nozzle provided on a mounting head and mounting the electronic component on a printed board.

2. Description of the Related Art

While this type of electronic component mounting apparatus has been known in the Japanese Patent Application Publication No. 2001-156498 and so on, chip components mounted by the electronic component mounting apparatus have been becoming smaller and smaller year by year.

Since a small electronic component is made thin, however, a lowering amount of a suction nozzle need be controlled corresponding to a thickness of the electronic component, when the suction nozzle is to be vertically moved in a mounting operation on a printed board, especially when it lowers. There have been a problem of difficulty in focusing a component recognition camera on a thick electronic component held by the suction nozzle for recognition in a case where an amount of a vertical moving stroke of the suction nozzle is reduced for improving accuracy in control of the lowering amount, or a problem of limiting a range of the electronic components to be picked up by the suction nozzle and to be mounted on the printed board because of the need to avoid grazing interference objects in a moving route of the nozzle for picking to mounting, that is, a problem of limiting a mounting operation of thick electronic components.

SUMMARY OF THE INVENTION

The invention provides an electronic component mounting apparatus that includes a component feeding unit supplying an electronic component to a component pickup position, a mounting head having a suction nozzle picking up the electronic component from the component pickup position and mounting the electronic component on a printed board, a first vertical movement device moving the mounting head in a vertical direction, and a second vertical movement device disposed on the mounting head and moving the suction nozzle in the vertical direction.

The invention also provides another electronic component mounting apparatus that includes a component feeding unit supplying an electronic component to a component pickup position, a beam movable between the component feeding unit and a component mounting area, a mounting head movable along the beam, and a plurality of suction nozzles disposed at one end of the mounting head. Each of the suction nozzles picks up a corresponding electronic component from the component pickup position and mounts the corresponding electronic component on a printed board placed in the component mounting area. The apparatus also includes a first vertical movement device moving the mounting head in a vertical direction, and a second vertical movement device disposed on the mounting head and moving the suction nozzles in the vertical direction.

The invention further provides other electronic component mounting apparatus that includes a component feeding unit supplying an electronic component to a component pickup position, a mounting head having a plurality of suction nozzles picking up the electronic component from the component pickup position and mounting the electronic component on a printed board, a first vertical movement device moving the mounting head in a vertical direction, a selection device selecting one of the suction nozzles, and a second vertical movement device moving in the vertical direction the suction nozzle selected by the selection device.

DETAILED DESCRIPTION OF THE INVENTION

Figure 1:
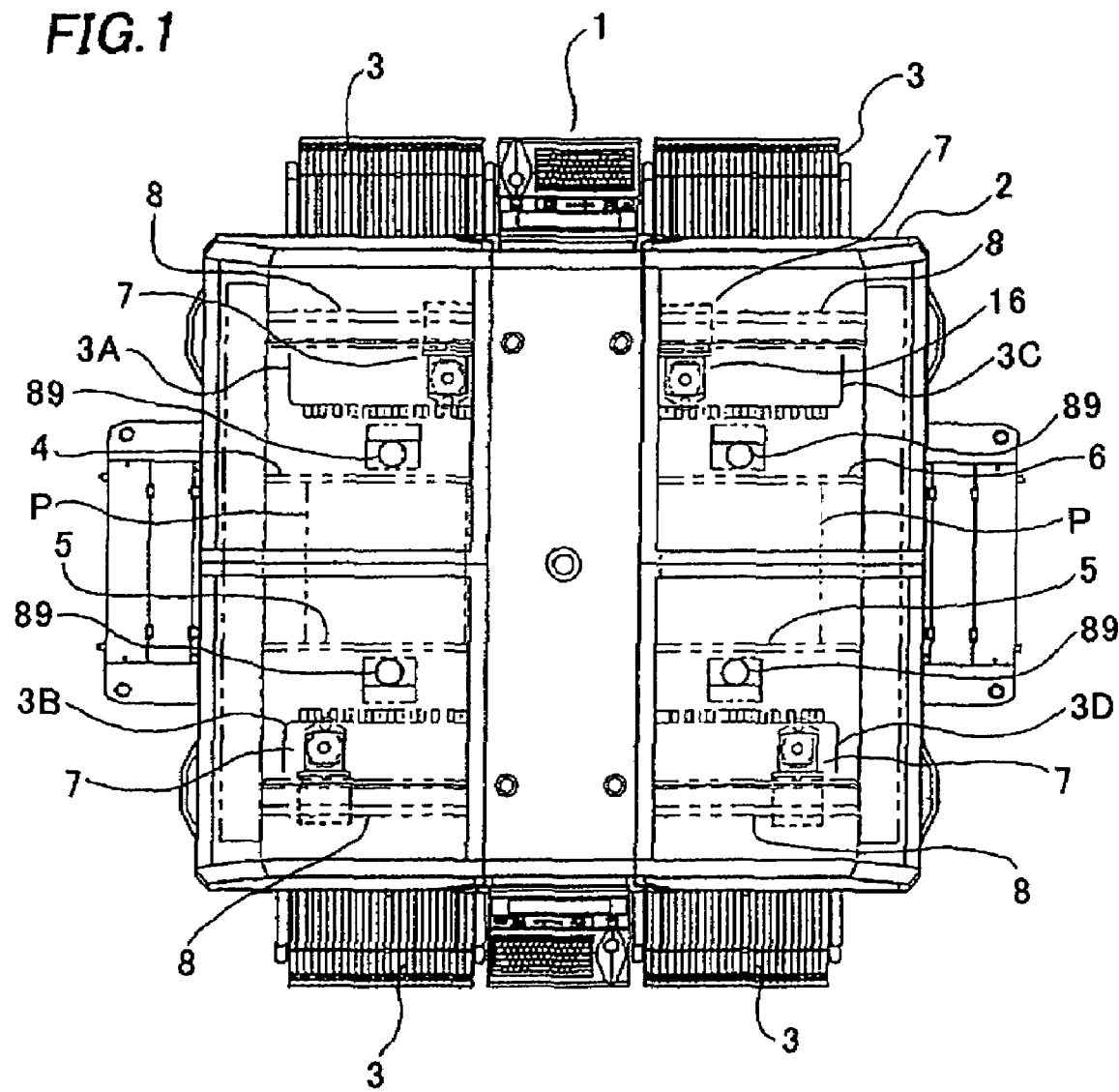
FIG. 1 is a plan view of an electronic component mounting apparatus of an embodiment of this invention.
Figure 2:
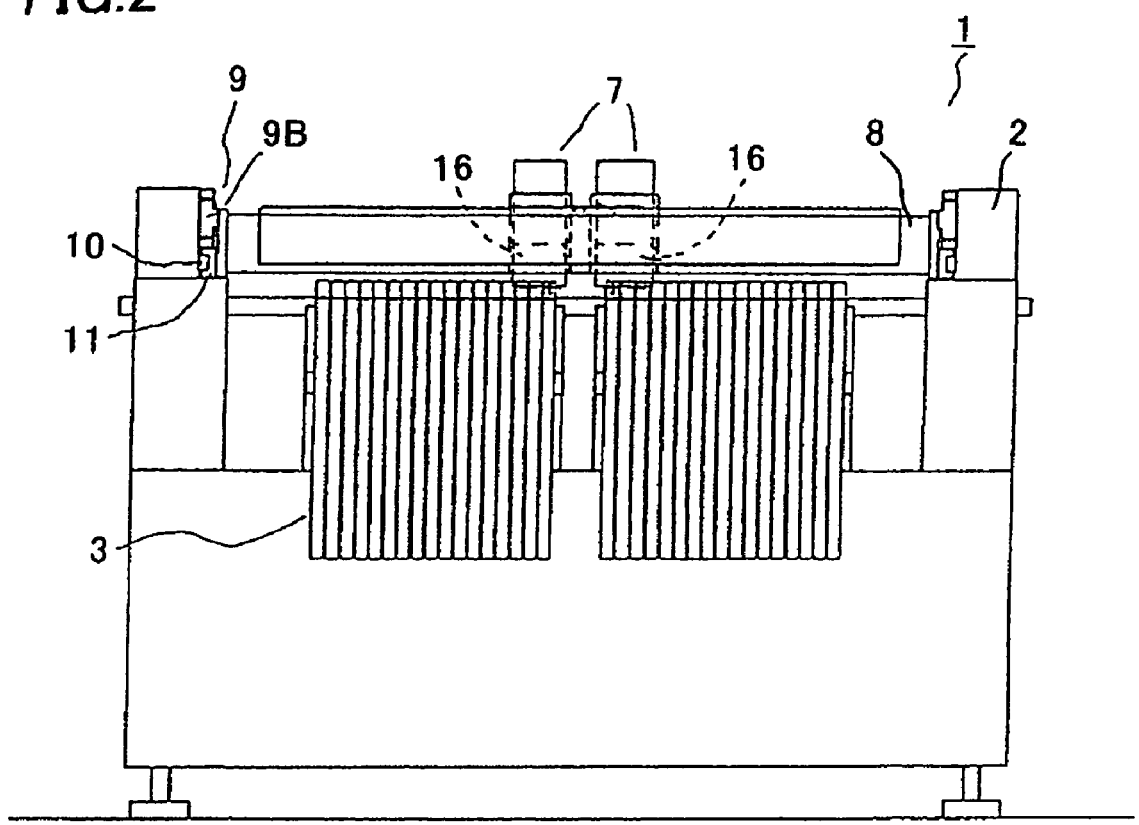
FIG. 2 is a front view of the electronic component mounting apparatus of FIG. 1.
Figure 3:
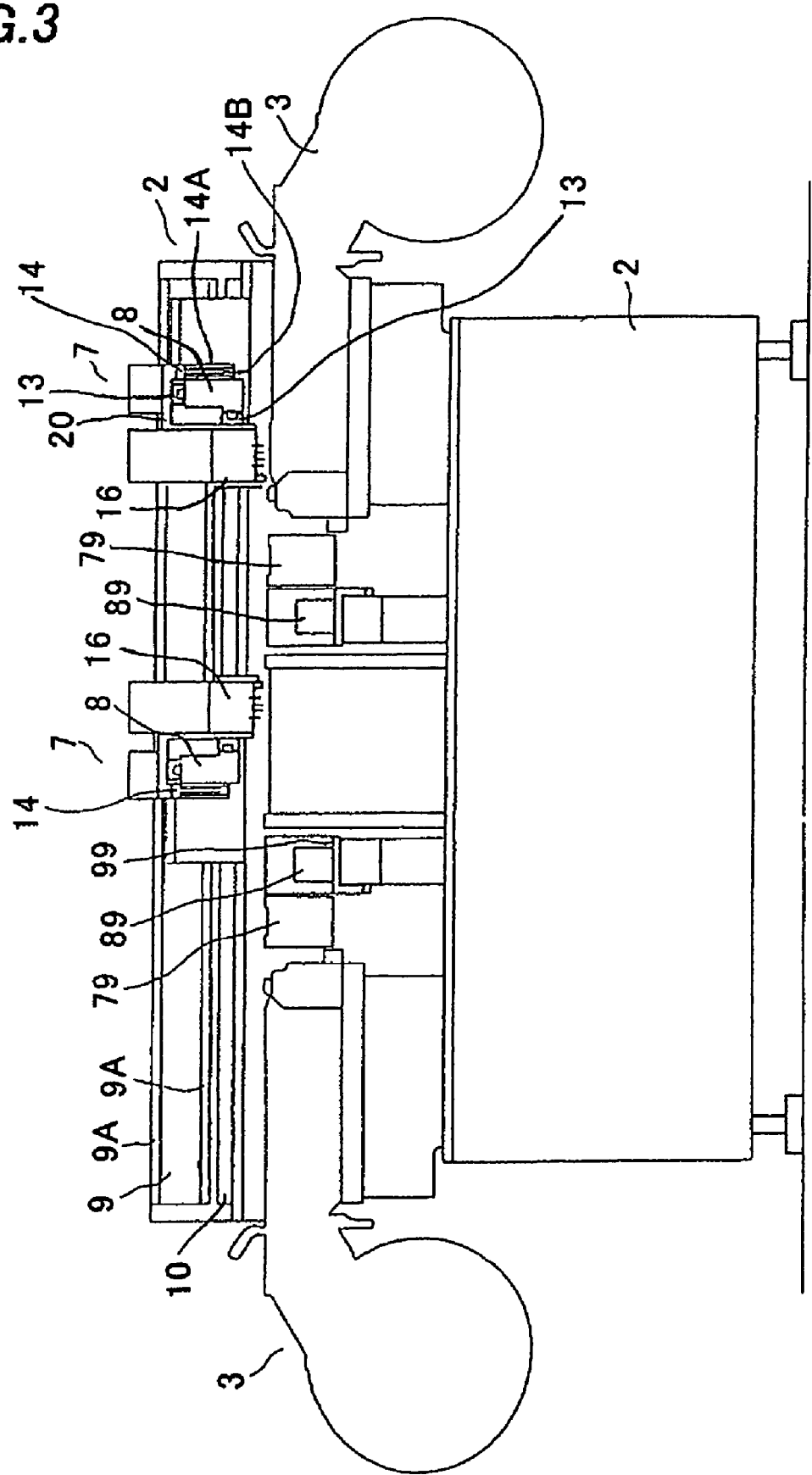
FIG. 3 is a right side view of the electronic component mounting apparatus of FIG. 1.

An embodiment of an electronic component mounting apparatus of the invention will be described with reference to the drawings. FIG. 1 is a plan view of an electronic component mounting apparatus 1, FIG. 2 is a front view of the electronic component mounting apparatus 1, and FIG. 3 is a right side view of the electronic component mounting apparatus 1. A plurality of component feeding units 3 for feeding a variety of electronic components one by one to each of component feeding positions (component pickup positions) is attachably and detachably aligned and fixed on feeder bases 3A, 3B, 3C, and 3D on a base 2 in the apparatus 1. A feed conveyer 4, a positioning portion 5, and a discharge conveyer 6 are provided between groups of the units 3 facing to each other. The feed conveyer 4 conveys a printed board P received from an upstream to the positioning portion 5, an electronic component is mounted on the printed board P positioned by a positioning device (not shown) in the positioning portion 5, and the printed board P is conveyed to the discharge conveyer 6.

A numeral 8 designates a pair of beams extending in an X direction. Each of the beams 8 respectively moves in a Y direction above the printed board P on the positioning portion 5 or the component feeding positions (component pickup positions) of the component feeding units 3 as sliders 11 fixed to each of the beams 8 slide along a pair of left and right guides 10, driven by each of linear motors 9. Each of the linear motors 9 has a pair of upper and lower stationary members 9A fixed on the base 2 and a moving member 9B fixed to a lower part of an attachment board 8A provided on each end of the beam 8.

Each of the beams 8 is provided with a mounting head body 7 which moves in a longitudinal direction, i.e., in the X direction along a guide 13 driven by the linear motor 14. The linear motor 14 has a pair of front and back stationary members 14A fixed to the beam 8 and a moving member 14B provided on the mounting head body 7 and between the stationary members 14A.

Each of the mounting head bodies 7 has a mounting head 16 having twelve suction nozzles 15 each fixed to and pulled down by each of twelve springs 12. A board recognition camera 19 is provided on the mounting head 16 in each of the mounting head bodies 7 and takes an image of a positioning mark (not shown) on the printed board P positioned on the positioning portion 5.

A vertical movement device for the mounting head 16 will be described in detail with reference to FIGS. 5 and 6. A numeral 20 designates a board of the mounting head body 7 moving along the guide 13, and a numeral 21 designates a beam side base fixed to this board 20. A numeral 22 designates a mounting head side base fixed to upper and lower portions of the mounting head 16. A head vertical movement device 23 is provided between this mounting head side base 22 and the beam side base 21.

The head vertical movement device 23 has a guide 24 guiding the mounting head 16 when the mounting head 16 vertically moves, a ball screw 25 attached to the beam side base 21, a rotation motor (referred to as a head vertical movement motor, hereafter) 26 vertically moving the mounting head 16 by rotating the ball screw 25, a vertical movement nut 27 engaged with the ball screw 25, and a support body 28 attached to the head vertical movement motor 26 and rotatably supporting an upper portion of the ball screw 25. The vertical movement nut 27 is fixed to the head side base 22. Thus, rotation of the ball screw 25 by rotation of the head vertical movement motor 26 makes the vertical movement nut 27 vertically move, resulting in vertical movement of the mounting head 16.

A numeral 30 designates a slip ring provided for communication between the mounting apparatus and the mounting head 16 and for power supply to a rotation motor of a nozzle support portion which will be described below. A numeral 31 designates a nozzle support body provided in a lower portion and supporting each of twelve nozzles 15 provided on a circumference thereof at predetermined intervals, which are vertically movable. A numeral 32 designates an outer cylinder in a lower portion, and a numeral 33 designates a nozzle rotation motor as a pulse motor for θ rotation provided between the outer cylinder 32 and the nozzle support body 31. A rotor 34 of this nozzle rotation motor 33 is provided on an outer circumference surface of the nozzle support body 31, being rotatable in a θ direction inside a stator 35 provided in the outer cylinder 32 together with the nozzle support body 31.

A numeral 37 designates a line sensor unit for detecting presence or absence, an attached posture, and a lower end of the electronic component, protruding downward from a center of the head support body 31. The line sensor unit 37 has a light emitting unit 45 and a light receiving unit 46. The light emitting unit 45 is provided in a lower end of the support body 38 in the almost center position of the mounting head 16, and has a light emitting element 42 such as an LED in an upper part of a cylindrical light emitting unit attachment body 41, a lens 43 below the light emitting element 42, and a reflector 44 having a conic reflective surface 44a provided below the lens 43. A light receiving unit 46 is fixed to a bottom surface of the outer cylinder 32, and has CCD elements as a plurality of light receiving elements for receiving light emitted from the light emitting element 42 through the reflector 44.

Figure 5:
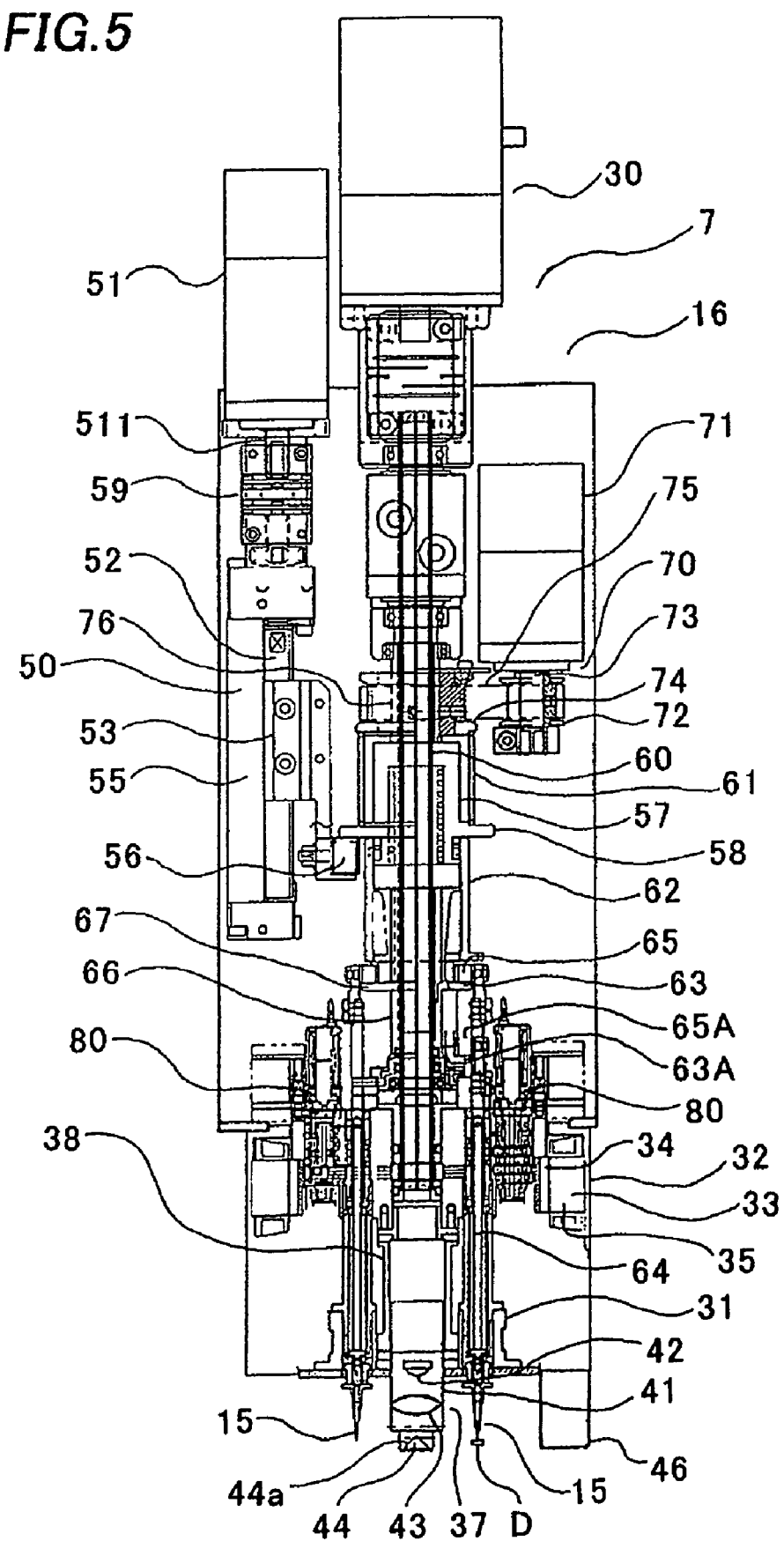
FIG. 5 is a longitudinal front view of a mounting head body of the electronic component mounting apparatus of FIG. 1.
Figure 6:
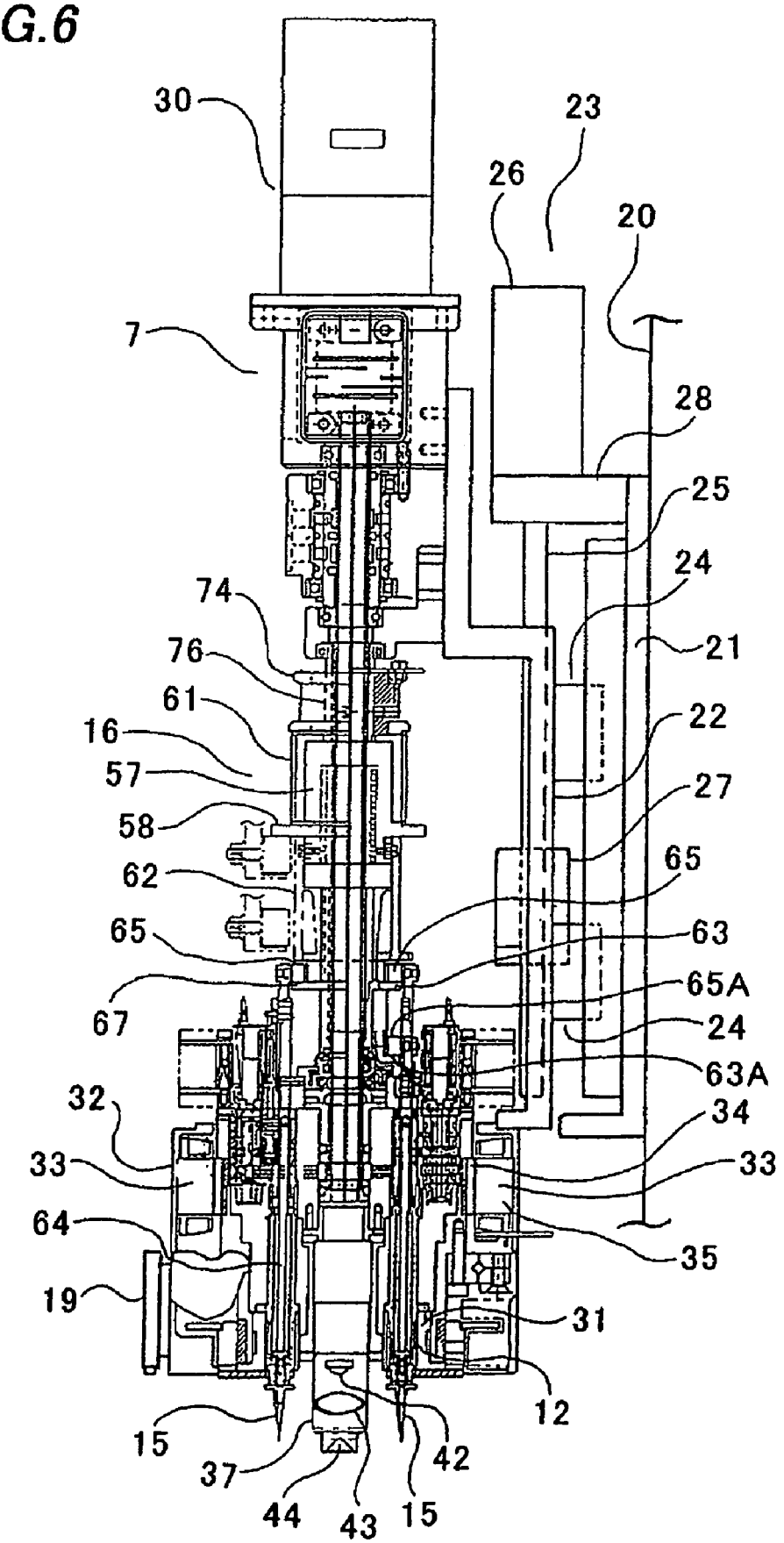
FIG. 6 is a longitudinal side view of the mounting head body of FIG. 5, holding a thin electronic component by suction.

This enables differentiating a case where the electronic component is picked up with a normal position as shown in FIG. 5 from a case where the component is picked up with its wrong surface being attached to the suction nozzle, i.e., standing or slanting, since height of a lower end surface of the electronic component D can be detected by recognizing a border between the position receiving no light and the position receiving light in each of the CCD elements in each time when the nozzle support body 31 rotates after a pickup operation of an electronic component D is completed by the suction nozzle 15 provided on the mounting head 16 and selected for picking the component. In detail, after the suction nozzle 15 lowers, picks up the electronic component D from the component feeding unit 3 by suction, and rises up, the nozzle rotation motor 33 is driven to rotate the nozzle support body 31 and rotate the suction nozzle 15 holding the electronic component D by suction. When the electronic component D held by the suction nozzle 15 comes between the reflector 44 and the light receiving unit 46 during rotation of the suction nozzle 15, presence or absence and an attached posture of the component can be detected by detecting height of the lower end surface of the electronic component D at plural positions. Although the detection is performed during rotation and movement of the nozzle support body 31 in this embodiment, alternatively the detection can be performed with the rotation being stopped when the electronic component D comes between the reflector 44 and the light receiving unit 46.

In a case where the suction nozzle 15 does not hold the electronic component D by suction, light emitted from the light emitting element 42, which should be shielded (by the held electronic component), is received by the light receiving unit 46. Thus, a detection result is "absence" of the electronic component D, so that by an operation of a solenoid valve 82 as a vacuum valve switch effector, which will be described below, provided on a side of each of the nozzle axes 64, a vacuum path is disconnected from a vacuum source to stop the vacuum suction, thereby preventing leakage. In a case where the electronic component is detected as being attached to the suction nozzle 15 at its wrong surface, i.e., with standing or slanting, the mounting head 16 and the suction nozzle 15 move to a position above an exhaust box 79, drops the electronic component D therein, and performs a picking process of the electronic component D again.

Even in a case where the electronic component is detected as being attached normally, a lower end level (lower end position) of the electronic component D can be detected so that a CPU 90 controls and changes an amount of a lowering stroke of the suction nozzle 15 for mounting the component D on the printed board P, corresponding to the lower end level. This compensates dimensional variations of the components caused by different manufacturers and so on.

A numeral 50 designates a nozzle vertical movement device provided on the mounting head 16. Description will be made on this nozzle vertical movement device, hereafter. A numeral 51 designates a motor for vertically moving a nozzle (referred to as a nozzle vertical movement motor, hereafter) attached to the head side base 22, and a numeral 52 designates a ball screw connected with a rotation axis 511 of the nozzle vertical movement motor 51 through a connection member 59 and rotating driven by the nozzle vertical movement motor 51, a numeral 53 designates a vertical movement body engaged with the ball screw 52 and vertically moving by rotation of the ball screw 52, a numeral 55 designates a guide attached to the head side base 22 and guiding the vertical movement body 53 for vertical moving, and a numeral 56 designates a roller rotatably attached to a lower end of the vertical movement body 53.

Furthermore, a numeral 57 designates a first cylinder where a center axis 60 of the mounting head 16 penetrates a center thereof, a roundel 58 formed on the first cylinder 57 is positioned on the roller 56, the fist cylinder 57 being supported by the roller 56. The first cylinder 57 is formed of a ball spline, for example, and pulled downward by a spring 61 of which a lower end is attached to an upper surface of the roundel 58. This first cylinder 57 rotates by θ with θ rotation of a pulley which will be described below, and vertically moves together with a vertical movement of the vertical movement body 53 and a vertical movement of the roller 56. A numeral 62 designates a nozzle support member fixed to a lower portion of the first cylinder 57 and rotates by θ with the first cylinder 57. A support piece 63 is formed on a lower end of this nozzle support member 62, horizontally lying in a circumference direction. This support piece (referred to as a vertical movement support piece) 63 vertically moves together with vertical movement of the first cylinder 57. The lowering of the vertical movement support piece 63 makes a predetermined nozzle 15 among a plurality of nozzles lower.

In detail, a roller 65 is rotatably attached to an upper end of each of the nozzle axes 64 extending upward from each of the nozzles 15. The roller 65 on the upper end of the nozzle axis 64 of the nozzle 15 selected by a nozzle selection device which will be described below lowers by lowering of the nozzle support member 62 and the vertical movement support piece 63 by lowering of the first cylinder 57, the roller 65 being positioned on an upper surface of the vertical movement support piece 63. In detail, when the vertical movement support piece 63 and the roller 65 lower to a position shown by the vertical movement support piece 63A and the roller 65A, for example, the predetermined nozzle 15 lower with this lowering. Furthermore, by controlling a rotation amount of the nozzle vertical movement motor 51 and adjusting a height where the vertical movement body 53 should stop during lowering, the suction nozzle 15 can lower by a predetermined stroke.

Figure 7:
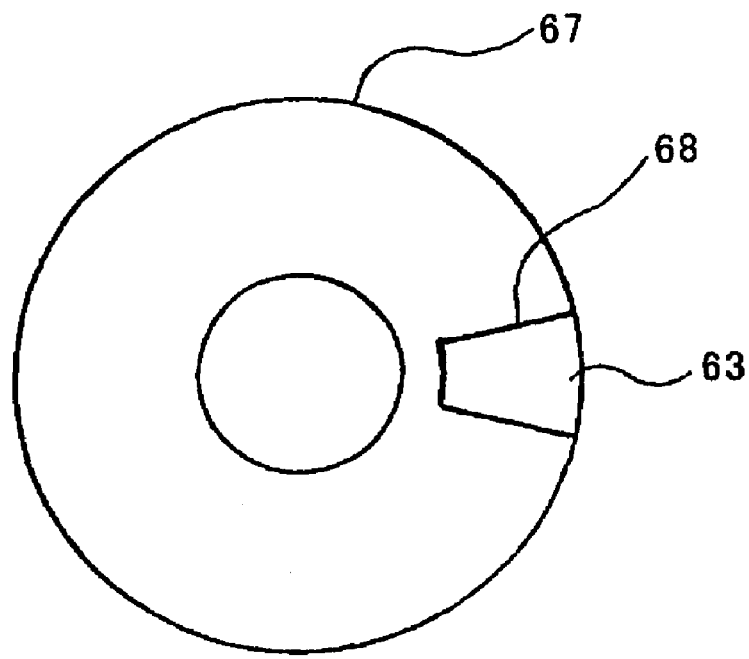
FIG. 7 is a plan view of a fixing support piece and a vertical movement support piece of the mounting head body of FIG. 5.

A numeral 66 designates a third cylinder provided under the nozzle support member 62, which is rotatable by θ. On an upper portion of this third cylinder 66, a support piece (referred to as a fixing support piece, hereafter) 67, which has a disk like shape, is formed at the same height as that of the vertical movement support piece 63 of the nozzle support member 62 before lowered. The fixing support piece 67 is formed with a notch 68 for the vertical movement support piece 63 as shown in FIG. 7. Each of the rollers 65 on the upper ends of the nozzle axes 64 of the nozzles 15 except the above-described nozzle 15 to be lowered is supported by the fixing support piece 67. That is, the fixing support piece 67 has the notch 68 formed in a position of one of some-degree divided pieces thereof calculated by dividing the piece 67 equally into the same number of pieces as the number of the nozzles 15 in a circumference direction, for example, in a position of a 30-degree piece which is one of 12 divided pieces in this embodiment. The vertical movement support piece 63 of the nozzle support member 62 is positioned in this notch 68.

A numeral 70 is a nozzle selection device provided on the mounting head 16, a numeral 71 designates a motor for selecting a nozzle to be lowered (referred to as a nozzle selection motor, hereafter), a numeral 72 designates a first pulley fixed to a rotation axis 73 of the nozzle selection motor 71, a numeral 74 designates a second pulley rotatably supported by the center axis 60, a numeral 75 designates a belt stretched between the first pulley 72 and the second pulley 74, and a numeral 76 designates a cylindrical rotator provided on an outside of the center axis 60, extending downward from a center of the second pulley 74. The spring 61 is provided between the second pulley 74 and the roundel 58 of the first cylinder 57.

The first cylinder 57 is formed on an outside of outer circumference of the lower portion of the rotator 76. By the function of the first cylinder 57 as a ball spline, the first cylinder 57 rotates with rotation of the second pulley 74 and rotation of the rotator 76. Furthermore, the first cylinder 57 vertically moves with vertical movement of the vertical movement body 53 along the rotator 76.

In detail, when the nozzle for picking and mounting the electronic component D is to be selected, the nozzle selection motor 71 rotates, so that the first cylinder 57 rotates through the first pulley 72, the belt 75, the second pulley 74, and the rotator 76. Then, the nozzle support member 62 connected with the first cylinder 57 rotates together with the third cylinder 66, so that the vertical movement support piece 63 of the nozzle support member 62 comes to the nozzle axis 64 extending from the selected nozzle 15. With this state, the nozzle vertical movement motor 51 rotates, and the vertical movement body 53 lowers corresponding to the thickness of the electronic component to be picked up and mounted, so that the first cylinder 57 and the nozzle support member 62 lower and thus the vertical movement support piece 63 lowers, thereby lowering only the selected nozzle 15 by a predetermined stroke corresponding to the thickness of the electronic component.

A numeral 80 is an air switch valve switchable in each of the nozzles 15, being provided for each of the nozzles 15 at predetermined intervals in the circumference direction on the outer side of the nozzles. This air switch valve 80 has a case 81 provided in an upper portion thereof, and a solenoid valve 82 of which the upper portion is positioned inside this case 81 and electrical conduction is controlled by a signal from the CPU 90. The solenoid valve 82 has a circular electromagnet 83 provided on an inner surface of the case 81, a path switch body 85 provided with a cylindrical permanent magnet 84 corresponding to the electromagnet 83 in its upper portion and vertically moving inside the case 81 according to electrical conduction and electrical non-conduction through the electromagnet 83, and so on. An air blow path (referred to as an air path, hereafter) 86, a nozzle connection path 87, and a vacuum leading path (referred to as a vacuum path, hereafter) 88 are formed on an outer circumference surface of the path switch body 85 in due order from upper to lower sides. Furthermore, the nozzle axis 64 has a nozzle axis path 100 connected with an inner path 151 of the nozzle 15 and the nozzle connection path 87. By the vertical movement of the path switch body 85, the connection of the nozzle path 100 switches to between the vacuum path 88 and the air path 86.

In detail, when the path switch body 85 rises by electrical conduction through the electromagnet 83, the vacuum path 88 and the nozzle connection path 87 are connected to each other, and the nozzle connection path 87 and the air path 86 are disconnected from each other. Therefore, the inner path 151 of the suction nozzle 15 is connected to a vacuum source (not shown) through the nozzle axis path 100, the nozzle connection path 87, and the vacuum path 88, so that the suction nozzle 15 keeps vacuum suction of the electronic component. On the other hand, when the connection switch body 85 lowers by electrical non-conduction through the electromagnet 83, the vacuum path 88 connected with the vacuum source and the nozzle connection path 87 are disconnected from each other, and the nozzle connection path 87 and the air path 86 are connected to each other. Therefore, the vacuum suction of the electronic component D by the suction nozzle 15 stops, and air from an air supply source is blown in the inner path 151 of the suction nozzle 15 through the air path 86, the nozzle connection path 87, and the nozzle axis path 100.

In this manner, the connection of the suction nozzle 15 with the vacuum source and the air supply source can be switched by electrical conduction and electrical non-conduction of the air switch valve 80 provided for each of the suction nozzles 15. Thus, the air switch valve 80 for the selected suction nozzle 15 can be switched independently.

A numeral 89 designates a component recognition camera. The component recognition camera 89 is provided on each of attachment boards 99 of the base 2 so that there are four cameras 83 in total each corresponding to each of the mounting heads 16. The camera 89 sequentially takes images of all the electronic components D picked up by the suction nozzles 15 to detect an amount of shifting from a proper position of the electronic component D on the suction nozzle 15 in X and Y directions and at rotating angles. The camera 89 can also take images of the plurality of the electronic components D at the same time. Furthermore, the component recognition camera 89 can recognize whether or not the electronic component D is held by suction by the suction nozzle 15 by taking an image.

Figure 4:
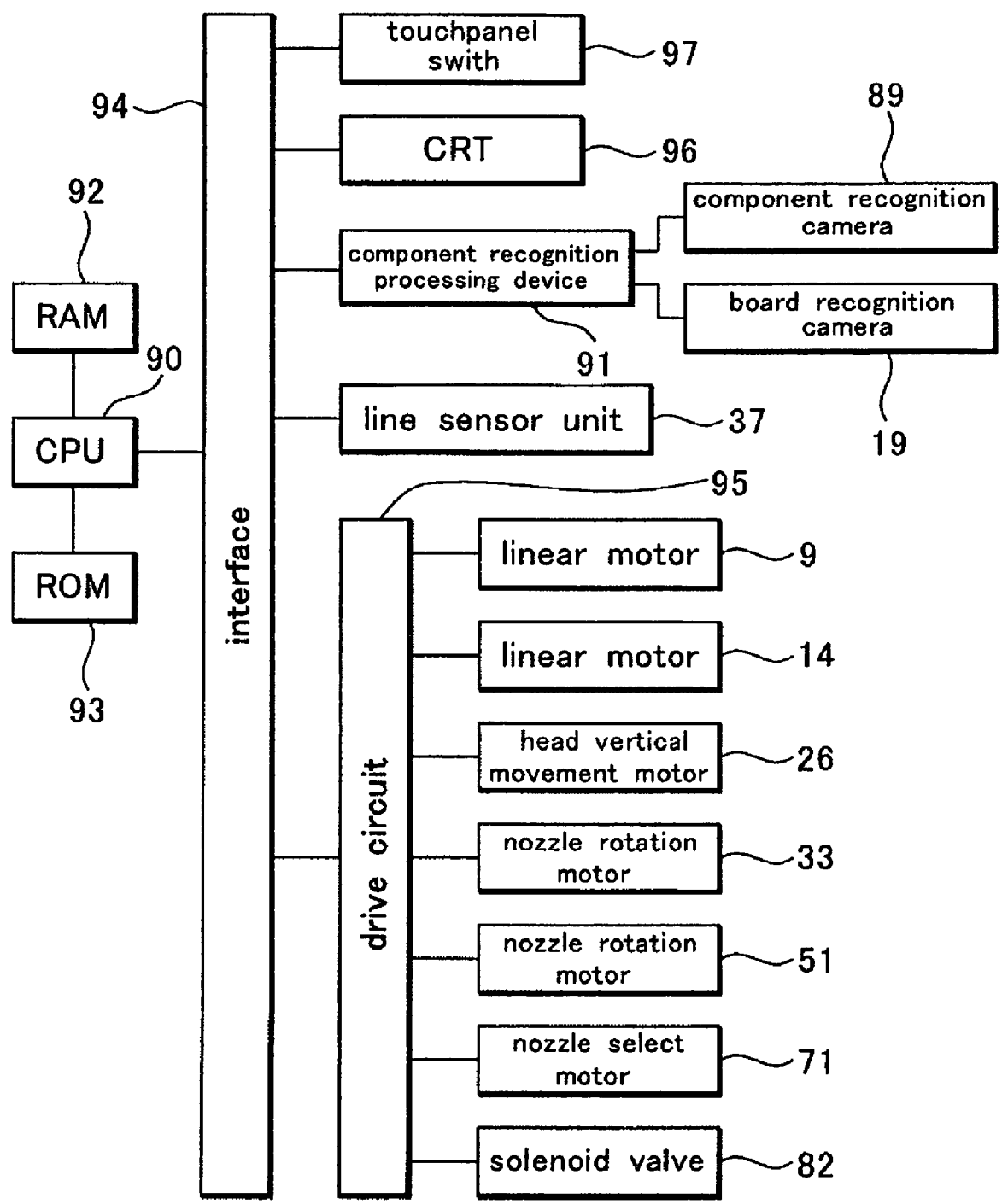
FIG. 4 is a control block diagram of the electronic component mounting apparatus of FIG. 1.

Next, description will be made with reference to a block diagram showing a control of the electronic component mounting apparatus 1 in FIG. 4. A numeral 90 designates the CPU (mounting control portion) as a control portion for controlling the mounting apparatus 1. The CPU 90 is connected with a RAM (random access memory) 92 and a ROM (read only memory) 93 through buses. The CPU 90 controls all operation for component mounting of the electronic component mounting apparatus 1 according to programs stored in the ROM 93 based on data stored in the RAM 92. That is, the CPU 90 controls driving of the linear motors 9 and 14, the head vertical movement motor 26, the nozzle rotation motor 33, the nozzle vertical movement motor 51, the nozzle selection motor 71, the solenoid valve 82, and so on through the interface 94 and the drive circuit 95.

The RAM 92 is stored with mounting data on component mounting which include values in the X and Y directions (indicated by X and Y respectively) and an angle (indicated by Z) on the printed board, alignment numbers of the component feeding units 3, and so on in order of component mounting (in order of step number). Furthermore, the RAM 92 is stored with component disposition data which include a type of the electronic component (component ID), alignment coordinates of the component feeding units 3, and so on corresponding to alignment numbers of the component feeding units 3.

A numeral 91 designates a component recognition processing device connected with the CPU 90 through the interface 94. In the component recognition processing device 91, images taken and stored by the component recognition camera 89 and the board recognition camera 19 undergo recognition processing.

The images taken by the component recognition camera 89 and the board recognition camera 19 are displayed on the CRT 96 as a display device. The CRT 96 is provided with various touch panel switches 97 and an operator operates the touch panel switches 97 for various settings including settings for informing.

The touch panel switches 97 include a glass substrate which is coated with a transparent conductive film on its whole surface and printed with electrodes on its four edges. When an operator touches one of the touch panel switches 97 in a state where minimal electric currents flow on the surface of the touch panel switches 97, current flows change at the four electrodes and coordinates of a touched position are calculated by a circuit board connected with the electrodes. If the calculated coordinates correspond to one of coordinates originally stored in the RAM 92, which will be described below, as a switch for executing a certain operation, the operation is executed.

Under the structure described above, a screen as shown in FIG. 10 is displayed on the CRT 96, and then selection is made from the line sensor unit 37 only, the component recognition camera 89 only, and both the line sensor unit 37 and the component recognition camera 89, for use for detecting whether or not the suction nozzle 15 still holds the electronic component after the mounting operation of the electronic component on the printed board P. Suppose that the line sensor unit 37 only is selected for the detection, first. An operator pushes a switch portion 100A and then a decision switch 100D to set the detection by the line sensor unit 37 only. The set content is stored in the RAM 92, and the CPU 90 controls a detecting operation according to a program corresponding to the set content stored in the ROM 93.

This setting can be performed on each group of the electronic components having a same type or in mounting order in the mounting data of electronic components.

Hereafter, the picking and mounting operation of the electronic component D by the electronic component mounting apparatus 1 will be described.

First, the printed board P is conveyed from upstream to the positioning portion 5 through the feed conveyer 4, and the positioning device starts a positioning operation.

Next, the CPU 90 forms pickup sequence data from the mounting data stored in the RAM 92. That is, the CPU 90 reads out data from the mounting data, decides a picking-up procedure of the suction nozzles 15, detects the last component feeding unit 3 which feeds the last electronic component D in a sequential picking-up process (12 components can be picked up for one mounting head 16 at maximum) and stores coordinates of a last pickup position of the component feeding unit 3 in the RAM 92, detects coordinates of a first mounting position of the component D after completing the sequential picking-up process (a position stored in mounting data before alignment) and stores the coordinates in the RAM 92.

Then, picking-up of the electronic components D is performed.

In detail, the suction nozzles 15 corresponding to types of the electronic components pick up the electronic components to be mounted from the predetermined component feeding units 3 according to the mounting data and so on stored in the RAM 92 where a position of an X abscissa and a Y ordinate on the printed board to be mounted with the component, a position at a rotation angle around a vertical axis, an alignment number and so on are specified. For this pickup operation, by the linear motors 9 and 14 controlled by the CPU 90, the suction nozzle 15 of the mounting head 16 in the mounting head body 7 moves to a position above the first electronic component in the component feeding unit 3 which has the electronic components to be mounted. Each of the head bodies 7 moves in the Y direction by moving of the beam 8 along the pair of the guides 10 driven by the linear motor 9 and in the X direction along the guides 13 driven by the linear motor 14, both the linear motors 9 and 14 being driven by the drive circuit 95.

At this time, the predetermined component feeding unit 3 is already driven and the electronic component is ready to be picked up at a feeding position of the unit 3. Therefore, based on a signal outputted by the CPU 90 through the interface 94 and the drive circuit 95, the head vertical movement motor 26 rotates and the mounting head 16 lowers to a predetermined height along the guide 24. Next, when the suction nozzle (referred to as a first suction nozzle, hereafter) 15 for picking the electronic component first is being shifted from a pickup position, that is, a pickup position 101 (set this position as 0 degree) shown in FIG. 8 which is a schematic bottom view of the mounting head 16, the CPU 90 outputs a signal to move the suction nozzle 15 to the pickup position 101 shown in FIG. 8, and the nozzle rotation motor 33 rotates based on this signal. By the drive of the nozzle rotation motor 33, the nozzle support body 31 of the mounting head 16 rotates by θ around the center axis 60.

At the time when the roller 65 comes on the vertical movement support piece 63, the CPU 90 outputs a signal to the nozzle vertical movement motor 51 through the interface 94 and the drive circuit 95 based on a rotation angle of the nozzle support body 31 and an angle of a side end of the vertical movement support piece 63 (a position shifted from a center of the vertical movement support piece 63 by 15 degrees). Based on this signal, the nozzle vertical movement motor 51 rotates in a direction for lowering the first suction nozzle 15, the ball screw 52 rotates to rotate the vertical movement body 53 and then the vertical movement support piece 63, and the first suction nozzle 15 lowers to a predetermined height suitable for picking the electronic component by suction from a feeding unit 3. In detail, by the θ rotation of the nozzle support body 31 and the lowering of the vertical movement support piece 63, the first suction nozzle 15 rotates and lowers, the roller 65 reaches the center of the vertical movement support piece 63, and thus the first suction nozzle 15 reaches the pickup position 101 and the height suitable for picking the electronic component.

In this manner, since the first suction nozzle 15 starts lowering during rotating toward the pickup position 101, the first suction nozzle 15 can perform its rotation to the pickup position 101 and its lowering, parallelly. This can reduce the time required for the picking operation of the electronic component D, resulting in reduction of the time required for mounting the electronic component on the printed board. The rotation and lowering of the suction nozzle 15 start while the mounting head 16 is moving in X and Y directions.

Furthermore, the first suction nozzle 15 can start its lowering much earlier than above during the nozzle support body 31 is rotating by θ described above. A control of this will be described hereafter.

Figure 8:
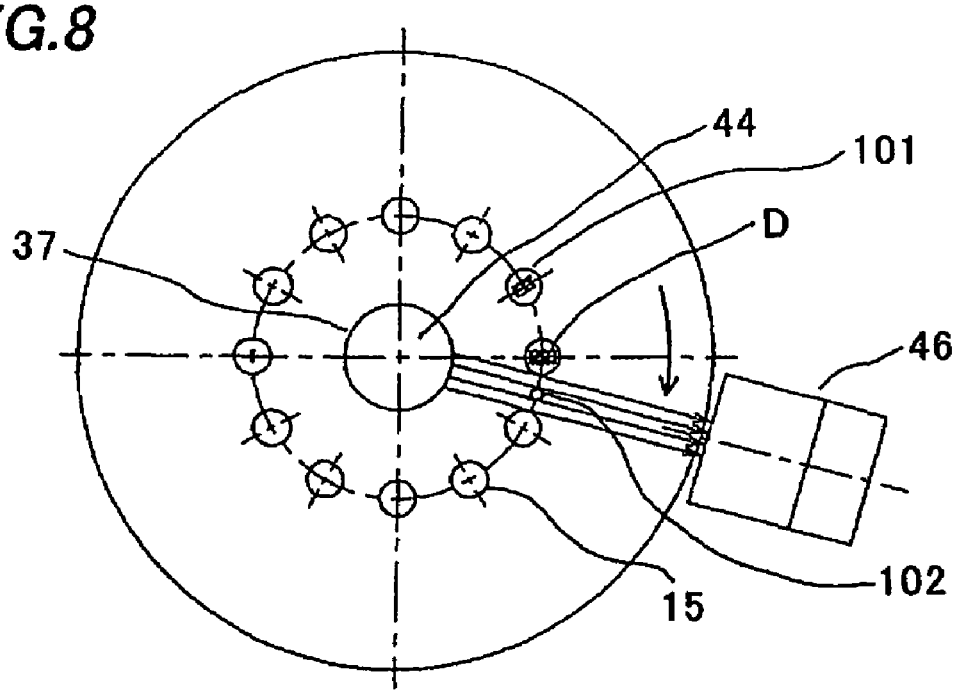
FIG. 8 is a schematic bottom view of the mounting head of FIG. 5.
Figure 9:
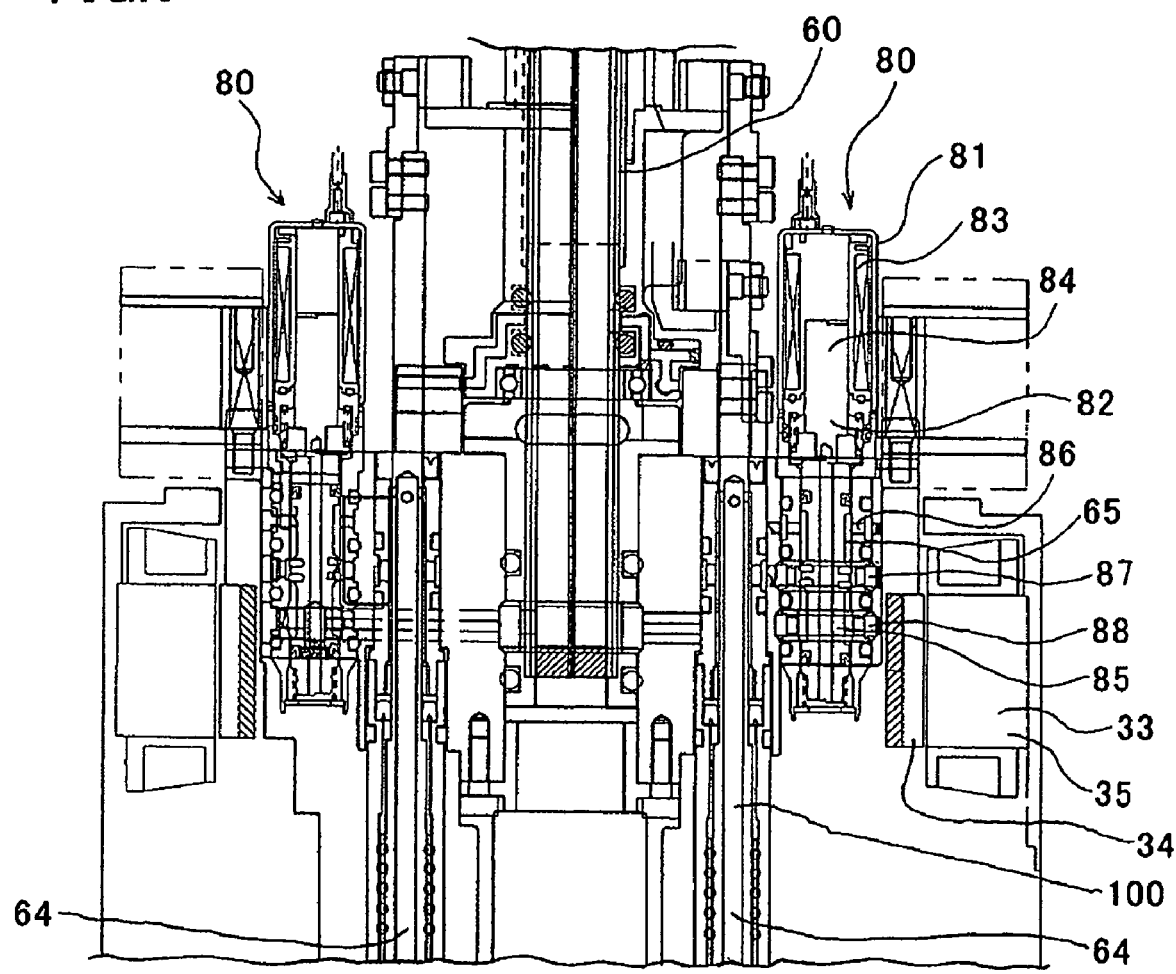
FIG. 9 is an enlarged longitudinal front view of a lower portion of the mounting head of FIG. 5.

The CPU 90 outputs a signal to move the suction nozzle 15 to the pickup position 101 shown in FIG. 8, and the nozzle selection motor 71 outputs a signal so that the vertical movement support piece 63 moves to a position corresponding to the first suction nozzle 15 based on the signal from the CPU 90. Therefore, by the drive of the nozzle rotation motor 33, the nozzle support body 31 of the mounting head 16 rotates around the center axis 60 by θ, and simultaneously the rotation of the nozzle selection motor 71 makes the nozzle support member 62 rotate through the first pulley 70, the belt 75, the second pulley 74, and the first cylinder 57. By the rotation of the nozzle support member 62, the vertical movement support piece 63 rotates to reach the position corresponding to the first suction nozzle 15 to be vertically moved.

Since the first suction nozzle 15 does not reach the pickup position 101 yet at this time, the nozzle support body 31 continues the θ rotation around the center axis 60. The CPU 90 outputs a signal to rotate the vertical movement support piece 63 so as to keep the position corresponding to the first suction nozzle 15, so that the vertical movement support piece 63 rotates with the θ rotation of the nozzle support body 31 by the rotation of the nozzle support member 62.

In addition, at the time when the vertical movement support piece 63 reaches the position corresponding to the first suction nozzle 15, the CPU 90 outputs a signal to the nozzle vertical movement motor 51 through the interface 94 and the drive circuit 95. Based on this signal, the nozzle vertical movement motor 51 rotates in a direction for lowering the first suction nozzle 15, the ball screw 52 rotates to lower the vertical movement body 53 and then the vertical movement support piece 63, so that the first suction nozzle 15 lowers to the predetermined height suitable for picking the electronic component from the feeding unit 3. Accordingly, by the θ rotation of the nozzle support body 31 and the lowering of the vertical movement support piece 63, the first suction nozzle 15 rotates and lowers to reach the pickup position 101 and the height suitable for picking the electronic component.

In this manner, the first suction nozzle 15 can perform its rotation to the pickup position 101 and its lowering parallelly, since the first suction nozzle 15 starts lowering from the time when the first suction nozzle 15 is still shifted from the pickup position 101 by 15 degrees or more during the first suction nozzle 15 is rotating to the pickup position 101. Therefore, the lowering of the first suction nozzle 15 can start much earlier, so that the time required for the pickup operation of the electronic component D can be more reduced, resulting in more reduction of the time required for mounting the electronic component on the printed board.

When the first suction nozzle 15 reaches the pickup position 101 and the height suitable for picking the electronic component, as described above, the solenoid valve 82 corresponding to the first suction nozzle 15 rises by electrical conduction based on a signal from the CPU 90 and the first suction nozzle 15 is connected with the vacuum source through the nozzle connection path 87 and the solenoid valve 82. Therefore, the first suction nozzle 15 picks up the electronic component D by suction.

When the pickup operation of the electronic component by the first suction nozzle 15 is completed as described above, the CPU 90 outputs a signal to the nozzle vertical movement motor 51. Based on this signal, the nozzle vertical movement motor 51 rotates in a direction for raising the first suction nozzle 15, the ball screw 52 rotates, and the vertical movement body 53 rises to the predetermined height, i.e. the height where the vertical movement body 53 has been before it lowers.

The CPU 90 outputs a signal to the nozzle vertical movement motor 51, and simultaneously outputs a signal to pick the electronic component by a second suction nozzle 15 next to the first suction nozzle 15. In detail, the CPU 90 outputs a signal to position the second suction nozzle 15 in a position above a component feeding portion of the component feeding unit 3 supplying the electronic component to be picked up and to position the second suction nozzle 15 in the pickup position by the nozzle support body 31. Then, by drive of each of linear motors 9 and 14 and the rotation of the nozzle rotation motor 33 based on the signal, the second suction nozzle 15 moves to above the component feeding unit 3 supplying the electronic component and rotates to the same pickup position as the pickup position which the first suction nozzle 15 reaches previously. In parallel with the rotation of the nozzle support body 31 by the rotation of the nozzle rotation motor 33, the nozzle selection motor 71 rotates based on the signal from the CPU 90, and by this rotation the nozzle support member 62 rotates. The rotation of the nozzle support member 62 makes the first support piece 63 rotate in a similar manner to the case of the first suction nozzle described above, and the first support piece 63 stops at the position corresponding to the second suction nozzle 15 to be vertically moved this time.

Then, in a similar manner to the case of the first suction nozzle 15, based on the signal from the CPU 90, the nozzle vertical movement motor 51 rotates, the solenoid valve 82 corresponding to the second suction nozzle 15 moves, the second suction nozzle 15 picks the electronic component by suction from the component feeding unit 3, and then rises up to the position where the nozzle 15 has been before it lowers.

Then, in a case where the electronic components can be sequentially picked up by the mounting head 16, a multiple sequential pickup is performed (the electronic components D are sequentially picked up as many as possible) by using each of the remaining suction nozzles selected for performing the pickup operation and the mounting operation from twelve suction nozzles 15 provided on the nozzle support body 31 and of which data for each of the operations are stored in the RAM 92, that is, by using each of the remaining suction nozzles selected from the suction nozzles from third to twelfth ones. That is, the electronic components for the remaining suction nozzles 15 supplied at the component feeding units 3 are sequentially picked up by the suction nozzles 15, by the vertical movement of each of the suction nozzles 15 performed when the nozzle support body 31 stops while intermittently rotating by the rotation of the nozzle rotation motor 33.

Hereafter, description will be made on the detection of presence or absence and an attached posture of the electronic component by the line sensor unit 37, which follows the pickup operation of the electronic component by each of the suction nozzles 15, with reference to FIG. 8.

The light receiving unit 46 of the line sensor unit 37 is provided in a position shifted by 45 degrees from the pickup position 101 shown in FIG. 8, for example. When the suction nozzle 15 holding the electronic component by suction passes a detection position 102 shown in FIG. 8 by intermittent rotation of the nozzle support body 31 in a direction shown by an arrow, the detection of presence or absence and an attached posture of the electronic component is performed at a lower end of the suction nozzle 15 by the line sensor unit 37 as described above.

In a case where the electronic component is detected as being attached to the suction nozzle 15 at its wrong surface, i.e., with standing or slanting, the mounting head 16 and the suction nozzle 15 move to a position above an exhaust box 79, drops the electronic component D therein, and performs a picking process of the electronic component D again. In a case where the electronic component is detected as being attached normally, the vacuum suction is kept and a lower end level (lower end position) of the electronic component D can be detected, so that the CPU 90 controls the nozzle vertical movement motor 51 so as to change an amount of a lowering stroke of the suction nozzle 15 for mounting the component D on the printed board P corresponding to the lower end level. This can compensate dimensional variations of the components caused by different manufacturers and on.

By controlling the drive of the nozzle vertical movement motor 51, the ball screw 52 is rotated by predetermined angles to lower the vertical movement body 53, and then the vertical movement support piece 63 lowers, thereby lowering the suction nozzle 15 by a predetermined stroke for mounting the electronic component D.

At the time when a last suction nozzle, for example, a twelfth suction nozzle 15 among the twelve suction nozzles 15 picks the electronic component by suction, this twelfth suction nozzle 15 is positioned in the pickup position 101 and the previous eleventh suction nozzle is positioned in a stop position 103 next to the pickup position 101. Therefore, the CPU 90 outputs a signal to the nozzle rotation motor 33 to intermittently rotate the nozzle support body 31 by 30 degrees two times. Then, first the electronic component held by the eleventh suction nozzle 15 passes the detection position 102, and the detection of presence or absence and an attached posture of the electronic component is performed by the line sensor unit 37. Then, the electronic component held by the twelfth suction nozzle 15 passes the detection position 102, and the detection of presence or absence and an attached posture of the electronic component is performed by the line sensor unit 37 similarly, thereby completing the detection of presence or absence and an attached posture of all the electronic components held by the suction nozzles 15.

When the pickup operation of the electronic component by each of the suction nozzles 15 and the detection of presence or absence and an attached posture of the electronic component on each of the suction nozzles 15 are completed, the CPU 90 forms a mounting sequence data. In a case where the electronic component held by each of the suction nozzles 15 is thick, for example, the CPU 90 outputs a signal to raise the mounting head 16, i.e. the mounting head body 7 so as to position the electronic component within a focus range of the component recognition camera 89 when the component recognition camera 89 performs component recognition processing. Based on this signal, the head vertical movement motor 26 rotates in a reverse direction to the direction for lowering. As a result, by actions of the ball screw 25 and the vertical movement nut 28, the mounting head body 7 starts rising to a predetermined height, i.e. a height where the electronic component can be positioned within the focus range of the component recognition camera 89.

In a case where the electronic component held by each of the suction nozzles 15 is thin, for example, and the electronic component can be positioned within the focus range of the component recognition camera 89 when each of the suction nozzles 15 of the nozzle support body 31 rises, the raising operation of the mounting head body 7 is not performed.

Accordingly, in the electronic component mounting apparatus 1, the height where the suction nozzle 15 picks the electronic component can be adjusted not only by the vertical movement of the suction nozzle 15 by the nozzle support body 31 but also by the vertical movement of the mounting head body 7 by the operation of the head vertical movement device 23, so that an adjusting range can be increased. This can increase a range of the electronic components to be picked up by the suction nozzle 15 of the mounting head 7 and mounted on the printed board.

At the same time when the raising operation starts in a case where the raising operation is performed, or after the set last suction nozzle 15 picks the electronic component in a case where the raising operation is not performed, the CPU 90 outputs a signal so that the mounting head 16 passes above the component recognition camera 89 and moves to a position of mounting coordinates on the printed board P positioned by the positioning portion 5. Based on the signal from the CPU 90, the linear motors 9 and 14 are controlled, and each of the mounting head bodies 7 moves in the Y direction by moving of the beam 8 along the pair of the guides 10 driven by the linear motor 9 and in the X direction along the guides 13 driven by the linear motor 14, both the linear motors 9 and 14 being driven by the drive circuit 95.

During the movement of the head body 7, the mounting head 16 passes above the component recognition cameras 89, and the component recognition cameras 89 simultaneously take and store images of all the electronic components D picked up by the suction nozzles 15 of the mounting head 16 by "on the fly recognition without stopping of the beam 8". Then, the component recognition processing device 91 starts a component recognition process.

After a recognition result for the first component to be mounted is calculated by the component recognition processing device 91, the CPU detects whether the suction nozzle 15 is positioned on a first mounting position (a position in mounting data before alignment of a pickup position) which is set as the coordinate value of the moving target position. If positioned, the CPU resets the coordinate value into a coordinate value of a moving target position calculated with the recognition (alignment) result and moves the beam 8 for positioning the suction nozzle 15 on a position of the reset target value. If not positioned, the set coordinate value of the moving target position is dynamically changed to the coordinate value calculated with the recognition (alignment) result.

Furthermore, based on the recognition result of the component recognition processing device 91, the CPU 90 calculates a pickup angle of the electronic component on each of the suction nozzles 15. Then, the CPU 90 compares a calculation result and a mounting angle in the mounting data stored in the RAM 92. In a case where there is a difference between the calculated pickup angle and the mounting angle, the CPU 90 outputs a signal to correct the pickup angle to the mounting angle, to the nozzle rotation motor 33. Then, the nozzle rotation motor 33 starts rotating during the mounting head body 7 is moving toward above the printed board, and this rotation makes the pickup angle of the electronic component on the suction nozzle corrected to the mounting angle.

The mounting head 7 continues its movement even after passing above the component recognition camera 89. In a case where the mounting head body 7 rises as described above, the CPU 90 outputs a signal to lower the mounting head body 7 during the movement. Then, the head vertical movement motor 26 rotates based on this signal, and by the rotation of the ball screw 25 the mounting head body 7 lowers to a height where the mounting head body 7 has been before it rises and reaches above the printed board. Then, the first electronic component D among the electronic components D is mounted on the printed board D.

Hereafter, description will be made on the mounting operation of the electronic component on the printed board by the suction nozzle 15. In the following description, the order of suction nozzles for mounting is the same as those for picking described above.

In the mounting operation, the first electronic component D held by suction by the first suction nozzle reaches the position of mounting coordinates by the movement of the mounting head body 7, and the first electronic component D is mounted on the printed board P by lowering the suction nozzle 15 by a predetermined stroke corresponding to the thickness of the electronic component D and the detection value of the lower end level of the electronic component D by the line sensor unit 37.

In this mounting operation, the CPU 90 outputs a signal to lower the suction nozzle 15 in the similar manner to the case of the pickup operation of the electronic component described above. Based on this signal, the nozzle vertical movement motor 51 rotates in the direction for lowering the first suction nozzle 15 and the ball screw 52 rotates, and thus the vertical movement body 53 lowers corresponding to the thickness of the electronic component D and the detection value of the lower end level of the electronic component D detected by the line sensor unit 37, so that the suction nozzle 15 lowers by a predetermined stroke and mounts the electronic component D on the printed board P.

When the suction nozzle 15 lowers, the solenoid valve 82 corresponding to the first suction nozzle 15 lowers by switching from electrical conduction to electrical non-conduction based on the signal from the CPU 90 and disconnects the first suction nozzle 15 from the vacuum source, so that the first suction nozzle 15 stops the vacuum suction operation. Then, air from the air supply source is blown in the inner path 151 of the first suction nozzle 15 through the air path 86 and the nozzle connection path 87.

The CPU 90 calculates next mounting operation of the electronic component D and repeats the mounting operation until all the picked electronic components D are mounted. In detail, the CPU 90 receives a recognition result calculated by the component recognition processing device 91, calculates a coordinate value of a moving target position in X, Y, and θ. Then, the CPU 90 drives the linear motor 9 to move the beam 8 in the Y direction to a target coordinate value calculated with the recognition result, drives the linear motor 14 to move the mounting head 16 in the X direction, drives the nozzle rotation motor 33 to rotate the nozzle support body 31 by θ, and rotates the suction nozzle 15. The CPU 90 also rotates the nozzle vertical movement motor 51, lowers the suction nozzle 15 by a predetermined stroke corresponding to the thickness of the component D, mounts the electronic component D on the printed board P, and then raises the suction nozzle 15 up. The CPU repeats this operation until all the electronic components D picked up by the suction nozzles 15 of the mounting head 16 are mounted on the printed board.

When the electronic component is mounted as described above, in a case where the mounting angle does not differ in each of the mounting operations, the nozzle support body 31 rotates by a predetermined angle, i.e. by 30 degrees in each time when the mounting operation is completed, so that the suction nozzles 15 are sequentially positioned at a predetermined angle, that is, in the same position as the pickup position 101 shown in FIG. 8, and the vertical movement of the suction nozzle 15 is performed in this position. On the other hand, in a case where the pickup angle of the electronic component on the suction nozzle 15 differs from the mounting angle of the electronic component in the electronic component mounting operation, or in a case where the pickup angle is shifted from the set mounting angle by recognizing the electronic component by the component recognition camera 89, the nozzle support body 31 is rotated by a shifting amount from the predetermined angle calculated from a relation between the pickup angle of the component on the suction nozzle 15 and the mounting angle. Furthermore, in a case where the position of the suction nozzle 15 is shifted from the pickup position 101, the CPU 90 outputs a signal to the nozzle selection motor 71 corresponding to a shifting amount of angle. Therefore, the vertical movement support piece 63 rotates by the rotation of the nozzle support body 31 when the component is to be mounted, and stops at a position corresponding to the suction nozzle 15 to be vertically moved. The suction nozzle 15 vertically moves in this position.

In detail, in a case where the pickup angle of the electronic component held by the suction nozzle 15 by suction differs from the mounting angle and thus the nozzle support body 31 is rotated, the nozzle selection motor 71 is rotated according to the rotation of the nozzle support body 31, and then the vertical movement support piece 63 is rotated and comes to the position corresponding to the suction nozzle 15 to be vertically moved. Thus, by vertically moving the suction nozzle 15, the electronic component can be mounted on the printed board without fail, thereby improving accuracy in the mounting operation.

Although the description of the pickup and the mounting of the electronic component D is made on the picking and mounting operation by one mounting head body 7 among four mounting head bodies 7 provided in the electronic component mounting apparatus 1, other mounting head bodies 7 also perform the picking and mounting operations of the electronic components similarly.

Then, the CPU 90 checks whether or not the brought-back component checking function is set. When the brought-back component checking function is not set, that is, the RAM 92 does not have a setting content of the brought-back component checking function, the electronic component pickup-operation according to the next mounting data, which is described above, will be performed.

Here, when the RAM 92 has the setting content of the brought-back component checking function, the CPU 90 checks whether or not a component checking function by the line sensor unit 37 is set. When the RAM 92 does not have a setting content of the component checking function by the line sensor unit 37, the electronic component pickup operation according to the next mounting data, which is described above, will be performed. When the RAM 92 has the setting content of the component checking function by the line sensor unit 37, the line sensor unit 37 performs detection of presence or absence of the electronic component by rotating the nozzle support body 31 as described above while the suction nozzle 15 of the mounting head 16 is moving to each of the component feeding units 3 storing the electronic component for next mounting.

When a result of the detection of presence or absence of the electronic component performed by the line sensor unit 37 is "absence", the pickup operation of the electronic component for next mounting starts. When the result is "presence", the CPU 90 checks whether or not the RAM 92 has a setting content of an error stop function. When the RAM 92 has the setting content of the error stop function, the CPU 90 controls the electronic component mounting apparatus 1 to stop the operation. When the RAM 92 does not have the setting content of the error stop function, the CPU 90 controls the suction nozzle 15 to move to a position above the exhaust box 79 and perform a discharging operation of the electronic component D.

After the discharging operation, the CPU 90 checks whether or not a setting content of a nozzle skip function is stored in the RAM 92. When the nozzle skip function is not stored in the RAM 92, a pickup operation of a next electronic component to be picked up starts. When the nozzle skip function is stored in the RAM 92, a skip process is performed to the appropriate suction nozzle 15 and the pickup operation of the next electronic component to be picked up starts.

There are twelve suction nozzles 15 attached to the mounting head 16 and some of the suction nozzles 15 are of same type. In the skip process, the CPU 90 controls so that the suction nozzle 15 which brings back the electronic component is not used but the other suction nozzle 15 of same type is used instead.

When all the electronic components D specified in the mounting data are not mounted on the printed board P, the pickup sequence data is formed again as described above, and the pickup operation, the component recognition processing, and the mounting operation of the electronic components D are performed. When all the electronic components D specified in the mounting data are mounted on the printed board P, the beam 8 is returned to an original position, and the printed board P completing component mounting is mounted on the discharging conveyer 6, completing the mounting operation.

Figure 10:
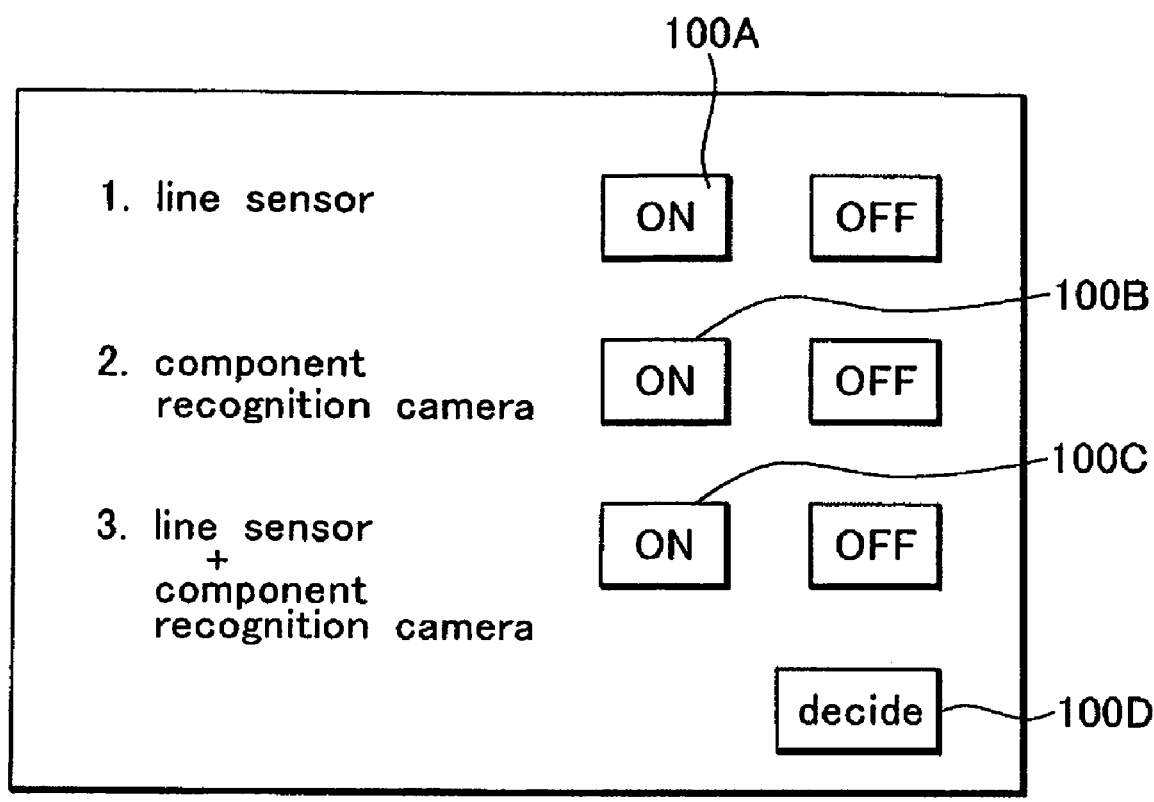
FIG. 10 is a view showing an operation screen displayed on a CRT of the electronic component mounting apparatus of FIG. 1.

In the next case, the screen as shown in FIG. 10 is displayed on the CRT 96, and then the component recognition camera 89 only is selected for use for detecting whether or not the suction nozzle 15 still holds the electronic component after the component mounting operation on the printed board P. An operator pushes a switch portion 100B and then the decision switch 100D to set the detection by the component recognition camera 89 only. The CPU then controls a detecting operation according to a program corresponding to the set content stored in the ROM 93.

Figure 11:
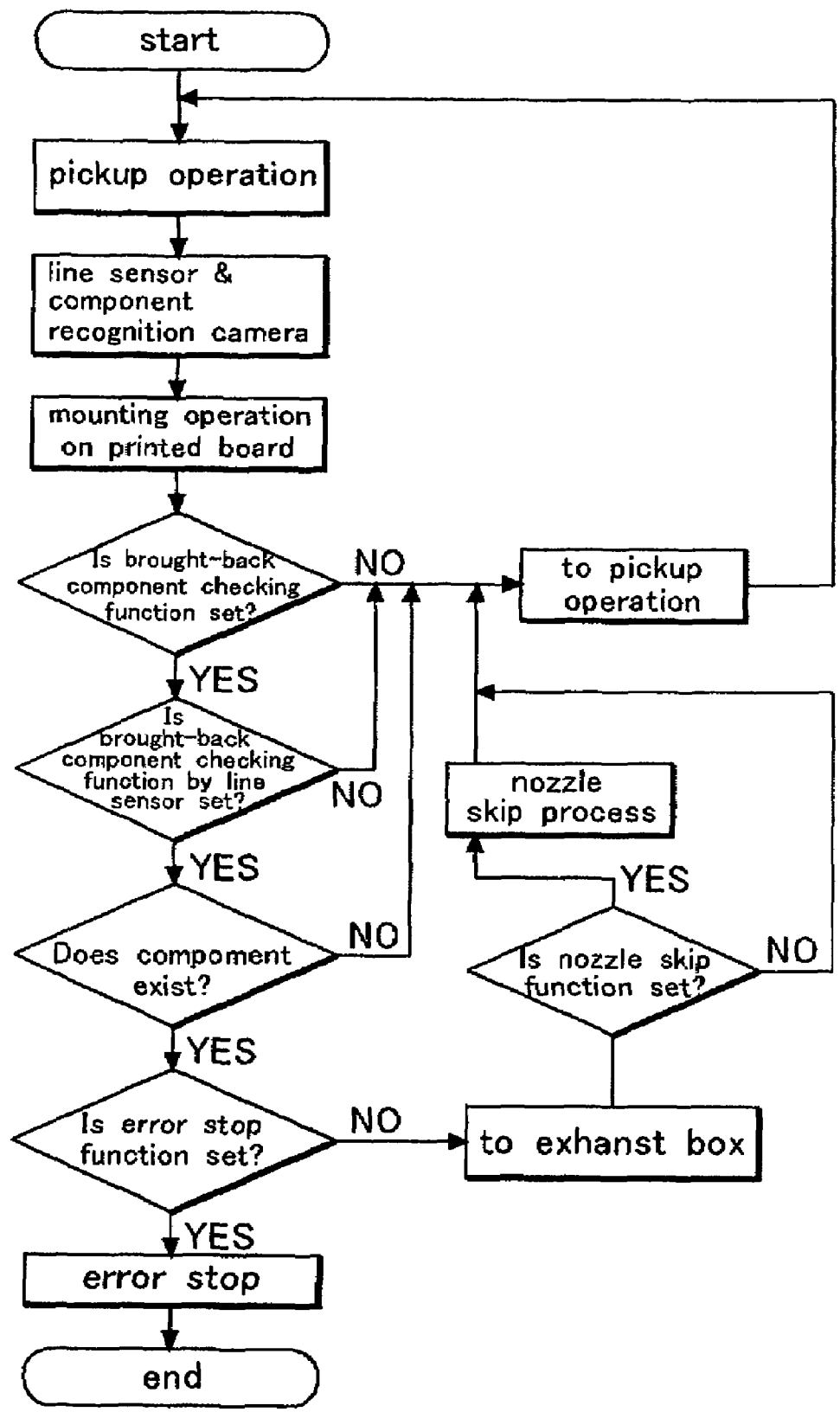
FIG. 11 is a flowchart of detection by a line sensor unit of the electronic component mounting apparatus of FIG. 1.
Figure 12:
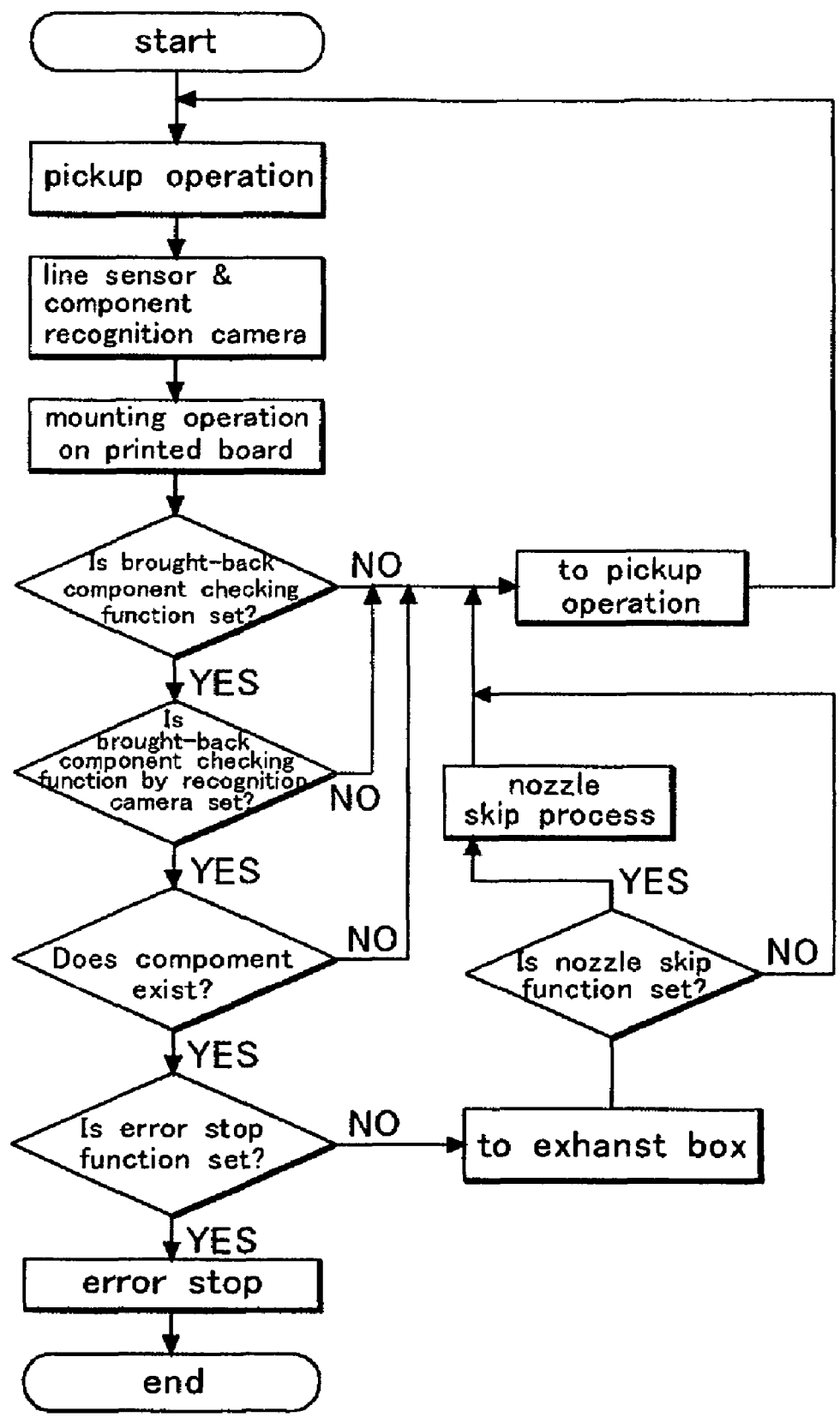
FIG. 12 is a flowchart of detection by a component recognition camera of the electronic component mounting apparatus of FIG. 1.

That is, control shown in a flow chart shown in FIG. 12 is performed. In this control, detection processing of the brought-back electronic component as shown in FIG. 11 is performed by the component recognition camera 89 and the component recognition processing device 91 only, instead of by the line sensor unit 37.

In the explanation below, some features of the mounting operation that have been already explained with respect to the line sensor unit only detection will be omitted. First, the printed board P is conveyed to the positioning portion 5 and positioned there, and the CPU 90 forms pickup sequence data from the mounting data stored in the RAM 92. Then, the cameras 89 can simultaneously take images of all the electronic components picked up by the suction nozzles 15 of the mounting head 16 by "on the fly recognition without stopping of the beam 8" at the time when the beam 8 is moving from the last pickup position to the first mounting position which will be described below.

Then, the suction nozzle 15 corresponding to type of the electronic component picks up the electronic component to be mounted from the predetermined component feeding unit 3 according to the mounting data and so on. After picking up the electronic component D, the suction nozzle 15 rises up by the rotation of the nozzle vertical movement motor 51, and the nozzle rotation motors 33 are driven to rotate the nozzle support body 31 and the suction nozzle 15. The picked electronic component D is positioned between the reflector 44 and the light receiving unit 46 during this rotation, so that detection of presence or absence and an attached posture of the electronic component D is performed by the line sensor unit 37.

When the electronic component D is detected as being attached normally, while keeping vacuum suction, a lower end level of the electronic component D can be detected so that the CPU 90 controls the nozzle vertical movement motor 51 to change an amount of a lowering stroke of the suction nozzle 15 for mounting the component D on the printed board P corresponding to the lower end level.

After that, multiple picking (sequential pickup of the components as much as possible) is performed, similarly. When completing this multiple pickup operation, the CPU 90 forms mounting sequence data and moves the beam 8 and the mounting head body 7 to a first mounting position where the component D is mounted on the printed board P first.

Then, when the CPU 90 detects timing for the component recognition cameras 89 to take images, the CPU makes the cameras 89 simultaneously take and store images of all the electronic components D picked up by the suction nozzles 15 of the mounting head 16 by "on the fly recognition without stopping of the beam 8" while the beam 8 is moving from the last pickup position to the first mounting position. Then, the component recognition processing device 91 starts a component recognition process.

When moving of the beam 8 is completed, the first electronic component D among the components D sequentially picked up is mounted on the printed board P. The CPU 90 calculates a next mounting operation of the other electronic component D, and repeats the mounting operation until all the picked electronic components D are mounted.

Then, the CPU 90 checks whether or not the brought-back component checking function is set. When the brought-back component checking function is not set, that is, the RAM 92 does not have a setting content of the brought-back component checking function, the electronic component pickup operation according to the next mounting data, which is described above, will be performed.

When the RAM 92 has the setting content of the brought-back component checking function, the CPU 90 checks whether or not a component checking function by the component recognition camera 89 and the component recognition processing device 91 is set. When the RAM 92 does not have a setting content of the component checking function by the component recognition camera 89 and the component recognition processing device 91, the electronic component pickup operation according to the next mounting data, which is described above, will be performed. When the RAM 92 has the setting content of the component checking function by the component recognition camera 89 and the component recognition processing device 91, the component recognition camera 89 takes an image and the component recognition processing device 91 performs recognition processing based on the image taken to perform the detection of presence or absence of the electronic component while the suction nozzle 15 of the mounting head 16 is moving to the component feeding unit 3 storing the electronic component for next mounting.

When a result of the detection of presence or absence of the electronic component D performed by the component recognition camera 89 and the component recognition processing device 91 is "absence", the pickup operation of the electronic component for next mounting starts. On the contrary, when the result is "presence", the CPU 90 checks whether or not the RAM 92 has the setting content of the error stop function. When the RAM 92 has the setting content of the error stop function, the CPU 90 controls the electronic component mounting apparatus 1 to stop the operation. When the RAM 92 does not have the setting content of the error stop function, the CPU 90 controls the suction nozzle 15 to move to a position above the exhaust box 79 and perform a discharging operation of the electronic component D.

After the discharging operation, the CPU 90 checks whether or not the setting content of the nozzle skip function is stored in the RAM 92. When the nozzle skip function is not stored in the RAM 92, a pickup operation of a next electronic component to be picked up starts. When the nozzle skip function is stored in the RAM 92, the skip process is performed to the appropriate suction nozzle 15 and the pickup operation of the next electronic component to be picked up starts.

That is, there are twelve suction nozzles 15 attached to the mounting head 16 and some of the suction nozzles 15 are of same type. In the skip process, the CPU 90 controls so that the suction nozzle 15 which brings back the electronic component D is not used but the other suction nozzle 15 of same type is used instead.

When all the electronic components D specified in the mounting data are not mounted on the printed board P, the pickup sequence data is formed again as described above, and the pickup operation, the component recognition processing, and the mounting operation of the electronic component D are performed. When all the electronic components D specified in the mounting data are mounted on the printed board P, the beam 8 is returned to an original position, and the printed board P completing component mounting is mounted on the discharging conveyer 6, completing the mounting operation.

In the next case, the screen as shown in FIG. 17 is displayed on the CRT 96, and then the line sensor unit 37 and the component recognition camera 89 are selected for use for detecting whether or not the suction nozzle 15 still holds the electronic component for mounting, which is small, after the component mounting operation on the printed board P. An operator pushes a switch portion 100C and then the decision switch 100D to set the detection by the line sensor unit 37 and the component recognition camera 89. The CPU 90 then controls a detecting operation according to a program corresponding to the set content stored in the ROM 93. This selection increases certainty in detection of presence or absence of an electronic component; since the detection result is "error" when either the line sensor unit 37 or the component recognition camera 89 detects the electronic component.

During the mounting head body 7 is moving to the component mounting position, the lowering amount of the mounting head body 7 when lowering to the height where the mounting head body 7 has been before it rises for the component recognition differs based on the thickness of the electronic component D held by the suction nozzle 15, the height of the chute of the positioning portion 5, and the height of the electronic component D already mounted on the printed board P. For example, when the electronic component held by the suction nozzle 15 is thick, the lowering amount is controlled to be small. Accordingly, in addition to the capability of adjusting the lowering amount of the mounting head body 7, the rising amount of the electronic component held by the suction nozzle 15 can be increased by raising the suction nozzle 15 and the mounting head body 7 when the electronic component held by the suction nozzle 15 need be raised because of the height of the electronic component D already mounted on the printed board. This can broaden the range of thicknesses of the mountable electronic components, compared with the case where only the suction nozzle 15 is vertically moved.

In the above embodiment, the description is made on the electronic component mounting apparatus where two mounting head bodies 7 are slidably provided on each of the two beams 8 each being independently slidable. However, the same effect can be obtained in the electronic component mounting apparatus where a beam is provided on each of front, back, left, and right sides, being independently slidable, and a mounting head body is provided in each of the four beams, for example, as long as the mounting head body has the same structure as that of the embodiment described above.

Although particular preferred embodiment of the invention has been disclosed in detail, it is recognized that variations or modifications of the disclosed apparatus are possible based on the disclosure and they lie within the scope of this invention.

What is claimed is:

1. An electronic component mounting apparatus comprising:
   a component feeding unit supplying an electronic component to a component pickup position;
   a beam movable between the component feeding unit and a component mounting area; a mounting head movable along the beam;

a plurality of suction nozzles disposed at one end of the mounting head, each of the suction nozzles picking up a corresponding electronic component from the component pickup position and mounting the corresponding electronic component on a printed board placed in the component mounting area;

a first vertical movement device driven by a first motor and moving the mounting head in a vertical direction based on a CPU signal outputted to the first motor; and a second vertical movement device driven by a second motor, disposed on the mounting head and moving the suction nozzles in the vertical direction based on a CPU signal outputted to the second motor.

2. The electronic component mounting apparatus of claim 1, wherein the mounting head comprises a nozzle support body that holds the suction nozzles at peripheral portions thereof and a rotation device rotating the nozzle support body around a vertical axis.

3. An electronic component mounting apparatus comprising:

a component feeding unit supplying an electronic component to a component pickup position;

a mounting head comprising a plurality of suction nozzles picking up the electronic component from the component pickup position and mounting the electronic component on a printed board;

a first vertical movement device driven by a first motor and moving the mounting head in a vertical direction based on a CPU signal outputted to the first motor; a selection device selecting one of the suction nozzles; and a second vertical movement device driven by a second motor and moving in the vertical direction based on a CPU signal outputted to the second motor the suction nozzle selected by the selection device, wherein the mounting head comprises a nozzle support body that holds the suction nozzles at peripheral portions thereof and a rotation device rotating the nozzle support body around a vertical axis.

4. An electronic component mounting apparatus comprising:

a component feeding unit supplying an electronic component to a component pickup position; a mounting head comprising a suction nozzle picking up the electronic component from the component pickup position and mounting the electronic component on a printed board;

a first vertical movement device driven by a first motor and moving the mounting head in a vertical direction based on a CPU signal outputted to the first motor; and a second vertical movement device driven by a second motor, disposed on the mounting head and moving the suction nozzle in the vertical direction based on a CPU signal outputted to the second motor, wherein the first vertical movement device is configured to position the electronic component within a focus range of a component recognition camera.

5. An electronic component mounting apparatus comprising:

a component feeding unit supplying an electronic component to a component pickup position; a mounting head comprising a suction nozzle picking up the electronic component from the component pickup position and mounting the electronic component on a printed board;

a first vertical movement device driven by a first motor and moving the mounting head in a vertical direction based on a CPU signal outputted to the first motor; and a second vertical movement device driven by a second motor, disposed on the mounting head and moving the suction nozzle in the vertical direction based on a CPU signal outputted to the second motor, wherein the mounting head is moved in the vertical direction an amount programmatically determined by the CPU.

6. An electronic component mounting comprising:

a component feeding unit supplying an electronic component to a component pickup position;

a mounting head comprising a plurality of suction nozzles picking up the electronic component from the component pickup position and mounting the electronic component on a printed board;

a first vertical movement device driven by a first motor and moving the mounting head in a vertical direction based on a CPU signal outputted to the first motor; a selection device selecting one of the suction nozzles; and a second vertical movement device driven by a second motor and moving in the vertical direction based on a CPU signal outputted to the second motor the suction nozzle selected by the selection device, wherein the second vertical movement device is disposed on the mounting head.

* * * * *